(12) United States Patent
Xu et al.

(10) Patent No.: US 12,203,977 B2
(45) Date of Patent: Jan. 21, 2025

(54) POWER-LOSS DELAY CIRCUIT AND DETECTION CONTROL CIRCUIT THEREOF

(71) Applicant: MORNSUN GUANGZHOU SCIENCE & TECHNOLOGY CO., LTD., Guangdong (CN)

(72) Inventors: Mengyang Xu, Guangdong (CN); Dongsheng Lan, Guangdong (CN); Gang Feng, Guangdong (CN)

(73) Assignee: MORNSUN GUANGZHOU SCIENCE & TECHNOLOGY CO., LTD., Guangdong (CN)

( * ) Notice: Subject to any disclaimer, the term of this patent is extended or adjusted under 35 U.S.C. 154(b) by 323 days.

(21) Appl. No.: 17/913,827

(22) PCT Filed: Dec. 29, 2021

(86) PCT No.: PCT/CN2021/142353
§ 371 (c)(1),
(2) Date: Sep. 23, 2022

(87) PCT Pub. No.: WO2022/143736
PCT Pub. Date: Jul. 7, 2022

(65) Prior Publication Data
US 2023/0341459 A1    Oct. 26, 2023

(30) Foreign Application Priority Data

Dec. 31, 2020 (CN) .......................... 202011615123.8

(51) Int. Cl.
*G01R 31/28* (2006.01)
*H02J 7/34* (2006.01)

(52) U.S. Cl.
CPC .......... *G01R 31/2843* (2013.01); *H02J 7/345* (2013.01)

(58) Field of Classification Search
CPC ........................... H02J 7/345; H02M 3/33523
See application file for complete search history.

(56) References Cited

U.S. PATENT DOCUMENTS

| 5,880,942 | A | * | 3/1999 | Leu | H02M 1/36 |
| | | | | | 363/21.16 |
| 6,788,557 | B2 | * | 9/2004 | Phadke | H02M 3/33569 |
| | | | | | 307/103 |

(Continued)

FOREIGN PATENT DOCUMENTS

| CN | 102064532 | 5/2011 |
| CN | 112003464 | 11/2020 |

(Continued)

OTHER PUBLICATIONS

Hao Chiang, "Design of power-fail detection and protection circuit in CMOS", China Integrated Circuit, Dec. 2010, submit with English abstract, pp. 56-59.

(Continued)

*Primary Examiner* — Kyle J Moody
(74) *Attorney, Agent, or Firm* — JCIP GLOBAL INC.

(57) ABSTRACT

Disclosed are a power-loss delay circuit and a detection control circuit thereof. The power-loss delay circuit and the corresponding detection control circuit are added onto a flyback circuit. When a product is working normally, an energy storage capacitor is charged, and when an input power supply of the product is cut off, the detection control circuit detects that an input voltage of the product drops to a set value and triggers the control circuit to drive a switch transistor to be turned on, so that the energy of an energy storage capacitor is released, thereby keeping the product working continuously for a period of time. The power-loss delay circuit and the detection control circuit thereof have no effect on the normal working state of the product. When the (Continued)

input power is cut off, capacitance stored in an external capacitor is introduced in time to keep the product working continuously.

8 Claims, 3 Drawing Sheets

(56) References Cited

U.S. PATENT DOCUMENTS 9,614,451 B2 * 4/2017 Fan Chiang ...... H02M 3/33561
10,615,681 B2 * 4/2020 Nonaka ............. H02M 3/33523

FOREIGN PATENT DOCUMENTS

| CN | 112564263 | 3/2021 |
| CN | 112615425 | 4/2021 |
| JP | 2017103870 | 6/2017 |

OTHER PUBLICATIONS

"International Search Report (Form PCT/ISA/210) of PCT/CN2021/142353," mailed on Jan. 29, 2022, with English translation thereof, pp. 1-5.

* cited by examiner

POWER-LOSS DELAY CIRCUIT AND DETECTION CONTROL CIRCUIT THEREOF

CROSS-REFERENCE TO RELATED APPLICATION

This application is a 371 of international application of PCT application serial no. PCT/CN2021/142353, filed on Dec. 29, 2021, which claims the priority benefit of China application no. 202011615123.8, filed on Dec. 31, 2020. The entirety of each of the above mentioned patent applications is hereby incorporated by reference herein and made a part of this specification.

TECHNICAL FIELD

The disclosure relates to the field of switching mode power supplies, in particular to a power-loss delay circuit and a detection control circuit thereof.

DESCRIPTION OF RELATED ART

Almost all electronic devices now require switching mode power supply in the power supply system as a key module for energy conversion. In some fields with high reliability requirements, such as railway power supplies, for reliable operation of electronic equipment, it is required that when the power supply is cut off, that is, the input voltage of switching mode power supply is suddenly powered off, the output energy may still be maintained for a certain period of time. The electronic device needs to store data in the power-off state and switch to the backup power supply in a timely manner. Therefore, the switching mode power supply system is required to have a long power-loss hold time. For example, in the field of railway power supply, the power-loss hold time is required to be no less than 10 ms.

In the related art, two methods are normally adopted to maintain a long power-loss hold time. The first method is to adopt a switching mode power supply with a single-stage topology design, such as a flyback. Typically the method is performed by directly connecting an electrolytic capacitor in parallel at the input side for energy storage. The capacitor energy storage formula $W=\frac{1}{2}*C*U^2$ shows that the higher the input voltage U is, the more energy W is stored, and the longer the power-loss hold time is under the same capacitance value C. Then this solution will lead to the problem of requirement of larger capacitance value in order to maintain the same power-loss hold time when the low-voltage is input, which brings difficulties to the system design of the modular power supply.

The second scheme uses a two-stage topology connected in series. The front stage uses a boost circuit to raise the input voltage to a certain value, and the latter stage uses a normal topology for transformation, such as flyback, forward excitation, and full bridge. The external energy storage capacitor is connected to the middle node of the two-stage topology, that is, the output end of the boost circuit. When the input energy is cut off, the external energy storage capacitor may continue to provide energy to the subsequent stage to achieve the power-loss hold time. Although the stored energy is greatly improved, because the two stages are connected in series, the circuit load is low, and the reliability is low. What is worse is that the efficiency will be much lower than that of the single-stage solution, and it will be completely impossible to achieve the advantages of product size and performance.

SUMMARY

In view of this, the present disclosure provides a power-loss delay circuit and a detection and control circuit thereof, which are applied to a switching mode power supply using a single-stage topology, so as to achieve the extension of the power-loss hold time. In the meantime, the efficiency is high, the circuit structure is simple, the reliability is high, and it is easy to achieve modularization of high power density.

The technical scheme provided by the present disclosure is as follows:

A power-loss delay circuit includes an energy storage capacitor C3, a charging circuit and a discharging circuit. The charging circuit includes auxiliary windings 3-4, a diode D3, a capacitor C4 and a boost circuit, and the discharging circuit includes a diode D1, a diode D2 and switch transistor Q1. The three terminals of the auxiliary winding are grounded, the four terminals of the auxiliary winding are connected to the anode of the diode D3, the cathode of the diode D3 is connected to one end of the capacitor C4 and the input terminal of the boost circuit, and the other end of the capacitor C4 is grounded. The output terminal of the boost circuit is connected to the anode of the energy storage capacitor C3 and the anode of the diode D2, the cathode of the energy storage capacitor C3 is grounded, the cathode of the diode D2 is connected to the drain of the switch transistor Q1, the source of the switch transistor Q1 is connected to the cathode of the diode D1 and the product input terminal B, and the anode of diode D1 is connected to the power input terminal A.

A detection control circuit applied to the above-mentioned power-loss delay circuit includes a voltage divider circuit, a comparator circuit, a high level maintaining circuit and a driving circuit. The input terminal of the voltage divider circuit is connected to the product input terminal B and the input terminal of the high level maintaining circuit. The output terminal of the voltage divider circuit is connected to the input terminal of the comparator circuit, the first output terminal of the comparator circuit is connected to the input terminal of the driving circuit and the output terminal of the high level maintaining circuit. The second output terminal of the comparator circuit is connected to the under-voltage control pin of the product, and the output terminal of the driving circuit is connected to the gate of the switch transistor Q1.

In a specific implementation of the above detection control circuit, the voltage divider circuit includes a resistor R1 and a resistor R2, one end of the resistor R1 is used as the input terminal of the voltage divider circuit, the other end of the resistor R1 and one end of the resistor R2 are connected as the output terminal of the voltage divider circuit, and the other end of the resistor R2 is grounded.

In a specific implementation of the above detection control circuit, the comparator circuit includes a comparator U1A, a comparator U1B and a diode D5, and the negative input terminal of the comparator U1B is connected to the positive input terminal of the comparator U1A as the input terminal of the comparator circuit. The positive input terminal of the comparator U1B is connected to the reference voltage REF1, the negative input terminal of the comparator U1A is connected to the reference voltage REF2, the output terminal of the comparator U1B is connected to the anode of the diode D5, and the cathode of the diode D5 is used as the first output terminal of the comparator circuit. The output terminal of the comparator U1A is used as the second output terminal of the comparator circuit.

In a specific implementation of the above detection control circuit, the high level maintaining circuit includes a switch transistor Q3, a resistor R3, a resistor R4, a diode D6, and a diode D7. The cathode of the diode D6 is used as the output terminal of the high level maintaining circuit. The anode of diode D6 is connected to the cathode of the diode D7 and one end of resistor R4, the anode of diode D7 is grounded, the other end of the resistor R4 is connected to one end of the resistor R3 and the base of switch transistor Q3, and the other end of the resistor R3 is connected to the collector of the switch transistor Q3 and the power input terminal A. The emitter of the switch transistor Q3 is used as the input terminal of the high level maintaining circuit.

A detection control circuit applied to the above-mentioned power-loss delay circuit includes a voltage divider circuit, a comparator circuit, a high level maintaining circuit and a driving circuit. The voltage divider circuit includes a resistor R1 and a resistor R2. The comparator circuit includes a comparator U1A, a comparator U1B, and a diode D5. The high level maintaining circuit includes a switch transistor Q3, a resistor R3, a resistor R4, a diode D6, and a diode D7. The product input terminal B is connected to one end of the resistor R1 and the emitter of the switch transistor Q3. The other end of the resistor R1 is connected to one end of the resistor R2, the negative input terminal of the comparator U1B, and the positive input terminal of the comparator U1A. The other end of the resistor R2 is grounded. The positive input terminal of the comparator U1B is connected to the reference voltage REF1, the negative input terminal of the comparator U1A is connected to the reference voltage REF2. The output terminal of the comparator U1A is connected to the under-voltage control pin of the product. The output terminal of the comparator U1B is connected to the anode of the diode D5. The cathode of the diode D5 is connected to the cathode of the diode D6 and the input terminal of the driving circuit. The output terminal of the driving circuit is connected to the gate of the switch transistor Q1, the anode of the diode D6 is connected to the cathode of the diode D7 and one end of the resistor R4. The anode of the diode D7 is grounded. The other end of the resistor R4 is connected to one end of the resistor R3 and the base of the switch transistor Q3, and the other end of the resistor R3 is connected to the collector of the switch transistor Q3 and the power input terminal A.

A detection control circuit applied to the above-mentioned power-loss delay circuit includes a voltage divider circuit, a comparator circuit and a driving circuit. The voltage divider circuit includes a resistor R1, a resistor R2, a resistor R3 and a resistor R4. The comparator circuit includes a comparator U1A and a comparator U1B. The power input terminal A is connected to one end of the resistor R3, the other end of the resistor R3 is connected to one end of the resistor R4 and the negative input terminal of the comparator U1B, and the product input terminal B is connected to one end of the resistor R1. The other end of the resistor R1 is connected to one end of the resistor R2 and the positive input terminal of the comparator U1A. The other end of the resistor R2 and the other end of the resistor R4 are grounded. The positive input terminal of the comparator U1B and the negative input terminal of the comparator U1A are connected to the reference voltage REF. The output terminal of the comparator U1A is connected to the under-voltage control pin of the product, the output terminal of the comparator U1B is connected to the input terminal of the driving circuit, and the output terminal of the driving circuit is connected to the gate of the switch transistor Q1.

A detection control circuit applied to the above-mentioned power-loss delay circuit includes a voltage divider circuit, a comparator circuit, a timing circuit and a driving circuit. The voltage divider circuit includes a resistor R1 and a resistor R2. The comparator circuit includes a comparator U1A and a comparator U1B. One end of the resistor R1 is connected to the product input terminal B, the other end of the resistor R1 is connected to one end of the resistor R2, the negative input terminal of the comparator U1B and the positive input terminal of the comparator U1A. The positive input terminal of the comparator U1B is connected to the reference voltage REF1. The negative input terminal of the comparator U1A is connected to the reference voltage REF2, the output terminal of the comparator U1A is connected to the under-voltage control pin of the product, and the output terminal of the comparator U1B is connected to the input terminal of the timing circuit. The output terminal of the timing circuit is connected to the input terminal of the driving circuit, and the output terminal of the driving circuit is connected to the gate of the switch transistor Q1.

The object of the present disclosure is achieved in the following manner. In a switching mode power supply with a single-stage topology, such as a flyback circuit, the primary winding of the switching mode power supply is connected in parallel with an auxiliary winding to couple to the output voltage, and the coupled voltage passes through half-wave rectification through turns ratio transformation. Then the voltage is raised to a constant value through the boost circuit. Because the output voltage is constant, so the coupled voltage also remains basically constant. After the voltage loop feedback of the boost circuit, it is ensured that the output voltage of the boost circuit does not change with the change in the input voltage. When the product is working normally, the energy storage capacitor C3 connected in series with the switch transistor Q1 is charged and stored. When the input voltage falls out of the normal input range, the detection control circuit controls the switch transistor Q1 to conduct, so that the energy stored in the energy storage capacitor C3 is released to the input terminal of the switching mode power supply through the switch transistor Q1.

Compared with the related art, the present disclosure has the following advantageous effects:

1. Since the process of storing energy in the energy storage capacitor is not affected by the operation of the main power circuit, the problem of reduced efficiency and reliability will not occur.
2. Since the energy stored by the energy storage capacitor will not be changed by the change of the input voltage, it is highly adaptable for power solutions under the condition of ultra-wide input voltage and low-voltage input.
3. For the isolated DC-DC converter, the auxiliary winding is coupled with the secondary winding, and the single-stage topology is adopted to realize the circuit logic. Compared with the two-stage scheme, the circuit reliability and efficiency are greatly improved.
4. The voltage of the energy storage capacitor may be raised to a higher level, and the energy storage capacitor with a smaller capacity may be selected to prolong the power-loss hold time and reduce the volume of the power supply unit of the electronic system.
5. In the application of ultra-wide input modular power supply, no matter what the voltage of the power supply system is, the same set of peripheral circuits may be used to solve the problem of power-loss hold time, which makes application of the whole system more convenient.

6. This control scheme may be set automatically along with adjustment according to the under-voltage point adjustment of the product to ensure that power-loss delay control can be realized under various under-voltage conditions.

DESCRIPTION OF THE EMBODIMENTS

In order to make the present disclosure to be more comprehensible to those skilled in the art, the present disclosure will be further described below with reference to specific implementation circuits.

First Embodiment

Figure 1:
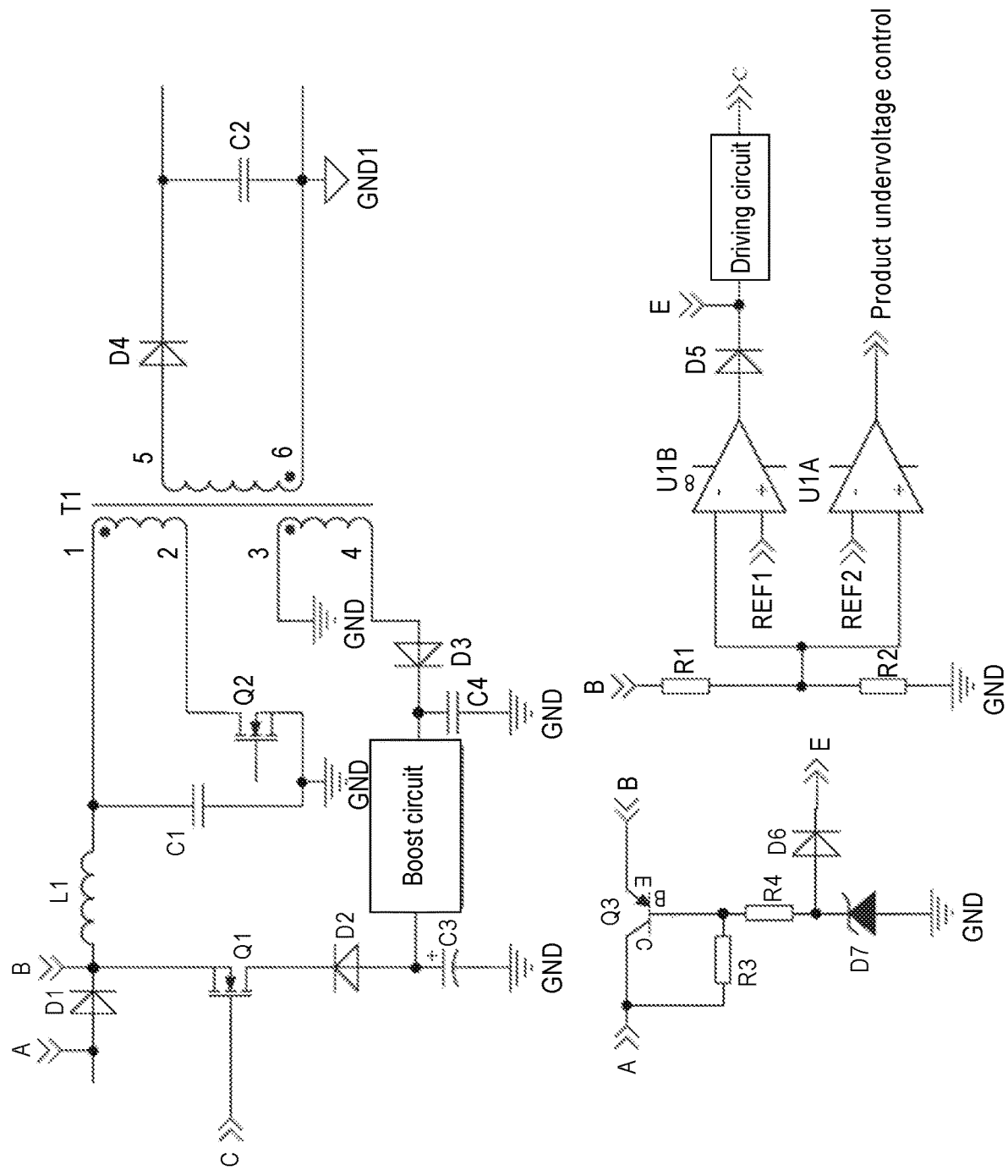
FIG. 1 is a principle diagram of a first embodiment of a power-loss delay circuit and a detection control circuit thereof according to the present disclosure.

As shown in FIG. 1, a power-loss delay circuit and a corresponding detection control circuit are added onto a single-stage topology flyback circuit. The power-loss delay circuit includes a storage capacitor C3, a charging circuit and a discharging circuit. The charging circuit includes auxiliary windings 3-4, a diode D3, a capacitor C4 and a boost circuit. The discharging circuit includes a diode D1, a diode D2 and a switch transistor Q1. The three terminals of the auxiliary winding are grounded, the four terminals of the auxiliary winding are connected to the anode of the diode D3, the cathode of the diode D3 is connected to one end of the capacitor C4 and the input terminal of the boost circuit, and the other end of the capacitor C4 is grounded. The output terminal of the boost circuit is connected to the anode of the energy storage capacitor C3 and the anode of the diode D2, the cathode of the energy storage capacitor C3 is grounded, the cathode of the diode D2 is connected to the drain of the switch transistor Q1, the source of the switch transistor Q1 is connected to the cathode of the diode D1 and the product input terminal B, and the anode of the diode D1 is connected to the power input terminal A.

A detection control circuit applied to the above-mentioned power-loss delay circuit includes a voltage divider circuit, a comparator circuit, a high level maintaining circuit and a driving circuit. The voltage divider circuit includes a resistor R1 and a resistor R2. The comparator circuit includes a comparator U1A, a comparator U1B, and a diode D5. The high level maintaining circuit includes a switch transistor Q3, a resistor R3, a resistor R4, a diode D6, and a diode D7. The product input terminal B is connected to one end of the resistor R1 and the emitter of the switch transistor Q3. The other end of the resistor R1 is connected to one end of the resistor R2, the negative input terminal of the comparator U1B, and the positive input terminal of the comparator U1A. The other end of the resistor R2 is grounded. The positive input terminal of the comparator U1B is connected to the reference voltage REF1, the negative input terminal of the comparator U1A is connected to the reference voltage REF2. The output terminal of the comparator U1A is connected to the under-voltage control pin of the product. The output terminal of the comparator U1B is connected to the anode of the diode D5. The cathode of the diode D5 is connected to the cathode of the diode D6 and the input terminal of the driving circuit. The output terminal of the driving circuit is connected to the gate of the switch transistor Q1, the anode of the diode D6 is connected to the cathode of the diode D7 and one end of the resistor R4. The anode of the diode D7 is grounded. The other end of the resistor R4 is connected to one end of the resistor R3 and the base of the switch transistor Q3, and the other end of the resistor R3 is connected to the collector of the switch transistor Q3 and the power input terminal A.

The boost circuit is not limited to a specific circuit, as long as the boost circuit can realize the boost function, such as a comparison boost circuit, a buck-boost circuit, a flyback circuit, a voltage multiplier circuit, and the like.

The switch transistor Q1 is a MOS transistor, and the switch transistor Q3 is a PNP transistor. The switch transistor is not limited to a specific device, as long as the control signal can cut off the discharge circuit, such as MOS transistor, IGBT, thyristor, relay, etc.

The comparator may be an integrated IC, such as LM2904, or a unit circuit with a comparison function built by any discrete components. The present disclosure does not limit the type of the comparator, as long as the comparator can realize the comparison function.

The working principle of this embodiment is as follows:

After the power is turned on, the charging circuit first fully charges the energy storage capacitor C3, and after the energy storage capacitor C3 is fully charged through the charging circuit, the charging circuit is in an open state. When the power supply of the input terminal is disconnected, the voltage of the power input terminal A will decrease. When the detection control circuit detects that the input voltage drops to a certain value, the comparator U1B outputs a high level to drive the switch transistor Q1 to conduct through the driving circuit, so that the energy of the energy storage capacitor C3 is released to the product input terminal B through the diode D2 and the switch transistor Q1. As a result, the voltage of the point B rises. Under the circumstances, the level at output terminal of the comparator U1B will be flipped to a low level, and the switch transistor Q1 will be turned off. However, due to the existence of a high level maintaining circuit, the switch transistor Q1 will continue to be turned on until the product is turned off under voltage.

The control logic is as follows. When the voltage at point B rises, the voltage at point B is higher than that at point A. Under the circumstances, the switch transistor Q3 is turned on, which will generate a high level at point E and continue to provide high level to the input terminal of the driving circuit. The switch transistor Q1 maintains conducted until the power input terminal A is introduced with energy, so that the voltage at point A is higher than the voltage at point B. Then, the switch transistor Q3 is turned off, and the high level maintaining circuit no longer provides high level for the input terminal of the driving circuit. The switch transistor Q1 is turned off, the energy storage capacitor C3 stops discharging, and the product is turned off to realize the power-loss delay control of the circuit. Alternatively, the energy of the energy storage capacitor C3 is released all the time, and the voltage at point B continues to decrease, so finally the under-voltage protection is triggered, the product is turned off to realize the power-loss delay control of the circuit.

Second Embodiment

Figure 2:
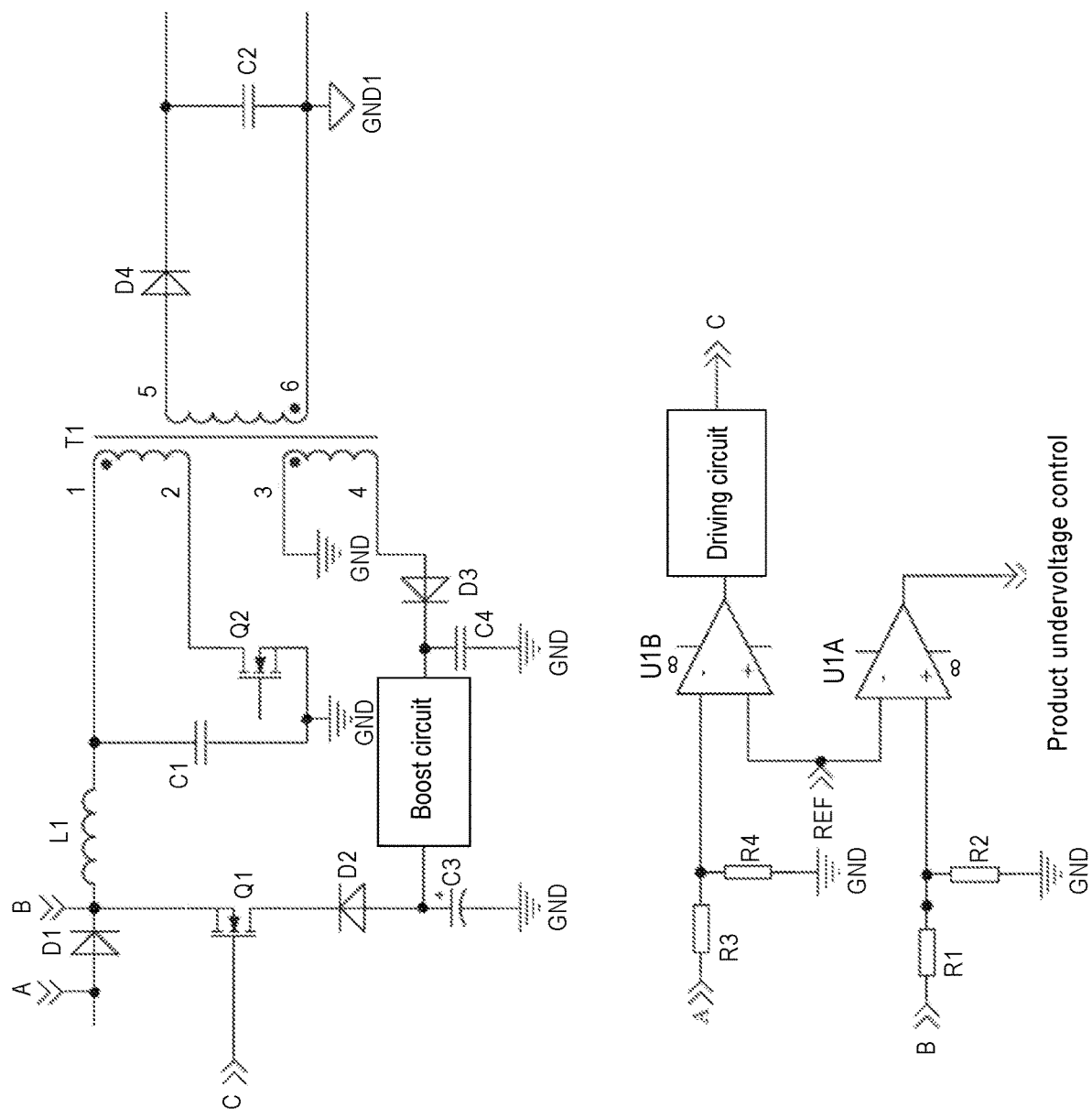
FIG. 2 is a principle diagram of a second embodiment of the power-loss delay circuit and the detection control circuit thereof according to the present disclosure.

This embodiment is shown in FIG. 2. The difference between this embodiment and the first embodiment is that the detection control circuit corresponding to the power-loss delay circuit is different.

A detection control circuit of the present embodiment includes a voltage divider circuit, a comparator circuit and a driving circuit. The voltage divider circuit includes a resistor R1, a resistor R2, a resistor R3 and a resistor R4. The comparator circuit includes a comparator U1A and a comparator U1B. The power input terminal A is connected to one end of the resistor R3, the other end of the resistor R3 is connected to one end of the resistor R4 and the negative input terminal of the comparator U1B, and the product input terminal B is connected to one end of the resistor R1. The other end of the resistor R1 is connected to one end of the resistor R2 and the positive input terminal of the comparator U1A. The other end of the resistor R2 and the other end of the resistor R4 are grounded. The positive input terminal of the comparator U1B and the negative input terminal of the comparator U1A are connected to the reference voltage REF. The output terminal of the comparator U1A is connected to the under-voltage control pin of the product, the output terminal of the comparator U1B is connected to the input terminal of the driving circuit, and the output terminal of the driving circuit is connected to the gate of the switch transistor Q1.

The working principle of this embodiment is as follows:

After the power is turned on, the charging circuit first fully charges the energy storage capacitor C3, and after the energy storage capacitor C3 is fully charged through the charging circuit, the charging circuit is in an open state. When the power supply of the input terminal is disconnected, the voltage of the power input terminal A will decrease. When the detection control circuit detects that the input voltage drops to a certain value, the comparator U1B outputs a high level to drive the switch transistor Q1 to conduct through the driving circuit, so that the energy of the energy storage capacitor C3 is released to the product input terminal B through the diode D2 and the switch transistor Q1. As a result, the voltage at point B rises again before reaching the under-voltage shutdown point of product. Due to the existence of the diode D1, the energy stored in the energy storage capacitor C3 will not be transmitted to the point A through the point B, so the divided voltage generated by the level of the point A is lower than the reference voltage REF. Under the circumstances, the output terminal of U1B continues to maintain a high level, and the switch transistor Q1 is always in an on state to release energy, until the voltage at point B continues to drop to trigger under-voltage protection, then the product is turned off, and the power-loss delay control of the circuit is realized.

Third Embodiment

Figure 3:
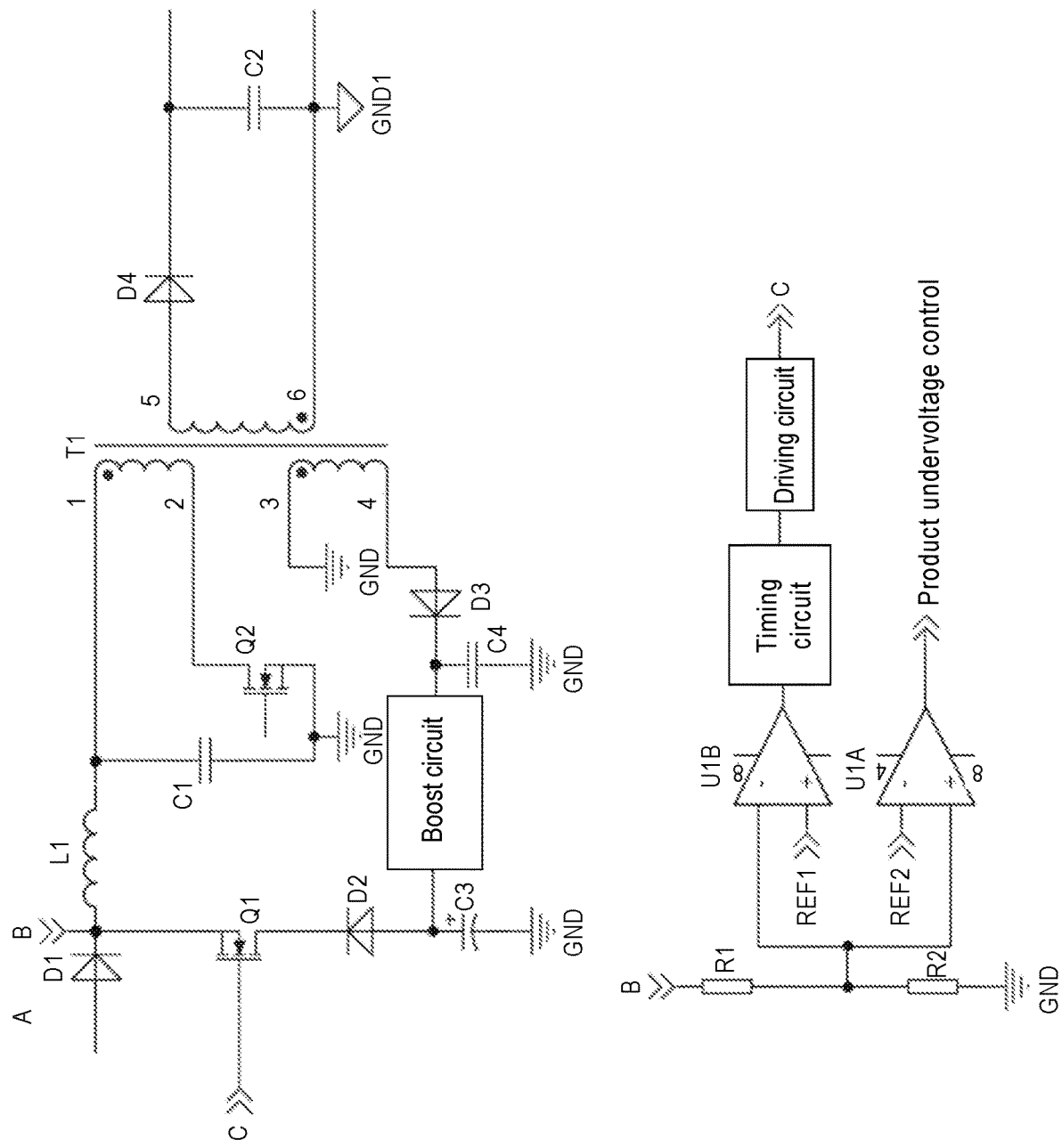
FIG. 3 is a principle diagram of a third embodiment of the power-loss delay circuit and the detection control circuit thereof according to the present disclosure.

This embodiment is shown in FIG. 3. The difference between this embodiment and the first embodiment is that the detection control circuit corresponding to the power-loss delay circuit is different.

A detection control circuit of the present embodiment includes a voltage divider circuit, a comparator circuit, a timing circuit and a driving circuit. The voltage divider circuit includes a resistor R1 and a resistor R2. The comparator circuit includes a comparator U1A and a comparator U1B. One end of the resistor R1 is connected to the product input terminal B, the other end of the resistor R1 is connected to one end of the resistor R2, the negative input terminal of the comparator U1B and the positive input terminal of the comparator U1A. The positive input terminal of the comparator U1B is connected to the reference voltage REF1. The negative input terminal of the comparator U1A is connected to the reference voltage REF2, the output terminal of the comparator U1A is connected to the under-voltage control pin of the product, and the output terminal of the comparator U1B is connected to the input terminal of the timing circuit. The output terminal of the timing circuit is connected to the input terminal of the driving circuit, and the output terminal of the driving circuit is connected to the gate of the switch transistor Q1.

The detection point of the under-voltage protection of the product in this embodiment and the detection point of the power-loss delay are at the same potential point B.

The working principle of this embodiment is as follows:

After the power is turned on, the charging circuit first fully charges the energy storage capacitor C3, and after the energy storage capacitor C3 is fully charged through the charging circuit, the charging circuit is in an open state. When the power supply of the input terminal is disconnected, the voltage of the point B will decrease. When the voltage of the comparator U1B is lower than the reference voltage REF1, the comparator U1B outputs a high level to drive the switch transistor Q1 to conduct through the driving circuit, and the energy of the energy storage capacitor C3 is released to the product input terminal B through the diode D2 and the switch transistor Q1, so that the voltage at point B rises again before reaching the under-voltage shutdown point of the product. Under the circumstances, the voltage of the negative input terminal of the comparator U1B will be higher than the reference voltage REF1 again, so that the level of the output terminal of the comparator is reversed to a low level. However, due to the existence of the timing circuit, the high level will be maintained for a certain period of time. Finally, there are two ways to turn off. One method is that the energy of the capacitor C3 is completely released, then the under-voltage protection is triggered, and the product is turned off. The other method is that the timing is over, and the timing circuit outputs a low level to turn off the switch transistor Q1 for the next determining operation.

When the input terminal of the timing circuit is at a high level, a high level will be maintained for a specified period of time, such as 50 ms (10 ms is generally required by products for railway power supplies), and the above time is adjustable. In this way, the switch transistor Q1 may be ensured to last at a high level for a certain period of time.

The above are only the preferred embodiments of the present disclosure. It should be noted that the above preferred embodiments should not be regarded as limitations of the present disclosure. For those skilled in the art, without departing from the spirit and scope of the present disclosure, several improvements and modifications can also be made, for example, the modification of the single-stage topology, the modification of the same-name terminal of the transformer T1, and the change of the switch transistor Q1 to other devices that can achieve the same function, such as MOS transistors, IGBTs, thyristors, relays, etc. For the modification of all circuits that realize this function, these improvements and modifications should also be regarded as the protection scope of the present disclosure, and the protection scope of the present disclosure should be subject to the scope defined by the claims.

What is claimed is:

1. A power-loss delay circuit, comprising an energy storage capacitor, a charging circuit and a discharging circuit, wherein the charging circuit comprises an auxiliary winding, a third diode, a second capacitor and a boost circuit, and the discharging circuit comprises a first diode, a second diode and a first switch transistor, a first terminal of the auxiliary winding is grounded, a second terminal of the auxiliary winding is connected to an anode of the third diode, a cathode of the third diode is connected to one end of the second capacitor and an input terminal of the boost circuit, and the other end of the second capacitor is grounded, an output terminal of the boost circuit is connected to an anode of the energy storage capacitor and an anode of the second diode, a cathode of the energy storage capacitor is grounded, a cathode of the second diode is connected to a drain of the first switch transistor, a source of the first switch transistor is connected to a cathode of the first diode and a product input terminal, and an anode of the first diode is connected to a power input terminal.

2. A detection control circuit applied to the power-loss delay circuit according to claim 1, comprising a voltage divider circuit, a comparator circuit, a high level maintaining circuit and a driving circuit, wherein an input terminal of the voltage divider circuit is connected to the product input terminal and an input terminal of the high level maintaining circuit, an output terminal of the voltage divider circuit is connected to an input terminal of the comparator circuit, a first output terminal of the comparator circuit is connected to an input terminal of the driving circuit and an output terminal of the high level maintaining circuit, a second output terminal of the comparator circuit is connected to an under-voltage control pin of a product, and an output terminal of the driving circuit is connected to a gate of the first switch transistor.

3. The detection control circuit according to claim 2, wherein the voltage divider circuit comprises a first resistor and a second resistor, one end of the first resistor is used as the input terminal of the voltage divider circuit, the other end of the first resistor and one end of the second resistor are connected as the output terminal of the voltage divider circuit, and the other end of the second resistor is grounded.

4. The detection control circuit according to claim 2, wherein the comparator circuit comprises a first comparator, a second comparator and a fifth diode, and a negative input terminal of the second comparator is connected to a positive input terminal of the first comparator as the input terminal of the comparator circuit, a positive input terminal of the second comparator is connected to a first reference voltage, a negative input terminal of the first comparator is connected to a second reference voltage, an output terminal of the second comparator is connected to an anode of the fifth diode, and a cathode of the fifth diode is used as the first output terminal of the comparator circuit, an output terminal of the first comparator is used as the second output terminal of the comparator circuit.

5. The detection control circuit according to claim 2, wherein the high level maintaining circuit comprises a third switch transistor, a third resistor, a fourth resistor, a sixth diode, and a seventh diode, a cathode of the sixth diode is used as the output terminal of the high level maintaining circuit, an anode of the sixth diode is connected to a cathode of the seventh diode and one end of the fourth resistor, an anode of the seventh diode is grounded, the other end of the fourth resistor is connected to one end of the third resistor and a base of the third switch transistor, and the other end of the third resistor is connected to a collector of the third switch transistor and the power input terminal, an emitter of the third switch transistor is used as the input terminal of the high level maintaining circuit.

6. A detection control circuit applied to the power-loss delay circuit according to claim 1, comprising a voltage divider circuit, a comparator circuit, a high level maintaining circuit and a driving circuit, wherein the voltage divider circuit comprises a first resistor and a second resistor, the comparator circuit comprises a first comparator, a second comparator, and a fifth diode, the high level maintaining circuit comprises a third switch transistor, a third resistor, a fourth resistor, a sixth diode, and a seventh diode, the product input terminal is connected to one end of the first resistor and an emitter of the third switch transistor, the other end of the first resistor is connected to one end of the second resistor, a negative input terminal of the second comparator, and a positive input terminal of the first comparator, the other end of the second resistor is grounded, a positive input terminal of the second comparator is connected to a first reference voltage, a negative input terminal of the first comparator is connected to a second reference voltage, an output terminal of the first comparator is connected to an under-voltage control pin of a product, an output terminal of the second comparator is connected to an anode of the fifth diode, a cathode of the fifth diode is connected to a cathode of the sixth diode and an input terminal of the driving circuit, an output terminal of the driving circuit is connected to a gate of the first switch transistor, an anode of the sixth diode is connected to a cathode of the seventh diode and one end of the fourth resistor, an anode of the seventh diode is grounded, the other end of the fourth resistor is connected to one end of the third resistor and a base of the third switch transistor, and the other end of the third resistor is connected to a collector of the third switch transistor and the power input terminal.

7. A detection control circuit applied to the power-loss delay circuit according to claim 1, comprising a voltage divider circuit, a comparator circuit and a driving circuit, wherein the voltage divider circuit comprises a first resistor, a second resistor, a third resistor and a fourth resistor, the comparator circuit comprises a first comparator and a second comparator, the power input terminal is connected to one end of the third resistor, the other end of the third resistor is connected to one end of the fourth resistor and a negative input terminal of the second comparator, the product input terminal is connected to one end of the first resistor, the other end of the first resistor is connected to one end of the second resistor and a positive input terminal of the first comparator, the other end of the second resistor and the other end of the fourth resistor are grounded, a positive input terminal of the second comparator and a negative input terminal of the first comparator are connected to a third reference voltage, an output terminal of the first comparator is connected to an under-voltage control pin of a product, an output terminal of the second comparator is connected to an input terminal of the driving circuit, and an output terminal of the driving circuit is connected to a gate of the first switch transistor.

8. A detection control circuit applied to the power-loss delay circuit according to claim 1, comprising a voltage divider circuit, a comparator circuit, a timing circuit and a driving circuit, wherein the voltage divider circuit comprises a first resistor and a second resistor, the comparator circuit comprises a first comparator and a second comparator, one end of the first resistor is connected to the product input terminal, the other end of the first resistor is connected to one end of the second resistor, a negative input terminal of the second comparator and a positive input terminal of the first comparator, a positive input terminal of the second comparator is connected to a first reference voltage, a negative input terminal of the first comparator is connected to a second reference voltage, an output terminal of the first comparator is connected to an under-voltage control pin of a product, and an output terminal of the second comparator is connected to an input terminal of the timing circuit, an output terminal of the timing circuit is connected to an input terminal of the driving circuit, and an output terminal of the driving circuit is connected to a gate of the first switch transistor.

\* \* \* \* \*